United States Patent [19]

Tanaka et al.

[11] Patent Number: 4,598,665
[45] Date of Patent: Jul. 8, 1986

[54] SILICON CARBIDE PROCESS TUBE FOR SEMICONDUCTOR WAFERS

[75] Inventors: Takashi Tanaka; Shigeru Abe, both of Yamagata, Japan

[73] Assignee: Toshiba Ceramics Co., Ltd., Tokyo, Japan

[21] Appl. No.: 685,794

[22] Filed: Dec. 24, 1984

[30] Foreign Application Priority Data

Dec. 26, 1983 [JP] Japan .................. 58-251857

[51] Int. Cl.$^4$ ............................................. C23C 16/00
[52] U.S. Cl. ..................... 118/715; 427/86; 427/93
[58] Field of Search ........... 29/569; 118/715; 138/177; 148/1.5; 427/51, 82, 93, 95

[56] References Cited

U.S. PATENT DOCUMENTS 2,677,627  5/1954  Montgomery et al. ............. 427/249
4,089,735  5/1978  Sussmann ........................ 156/612

OTHER PUBLICATIONS

"The Etching of α-Silicon Carbide", Brander et al., Brit. J. of Applied Physics, 1967, vol. 18, pp. 905–912.
"Kinetic Studies on the Oxidation of Silicon Dioxide", Fitzer et al., Proc. 3rd Int. Conf., Sep. 17–20, 1973, pp. 320–336.

Primary Examiner—Stephen Marcus
Assistant Examiner—Mark Thronson
Attorney, Agent, or Firm—Oblon, Fisher, Spivak, McClelland & Maier

[57] ABSTRACT

A silicon carbide process tube which can be used for heat-treating a semiconductor device in a diffusion step, oxidation step and etc.. This silicon carbide process tube is characterized in that the inner surface of the process tube has a surface coarseness of 150 μm or less.

2 Claims, 2 Drawing Figures

SILICON CARBIDE PROCESS TUBE FOR SEMICONDUCTOR WAFERS

BACKGROUND OF THE INVENTION (a) Field of the Invention

This invention relates to a silicon carbide process tube used for the heat treatment of semiconductor wafers.

(b) Description of the Prior Art

A process tube is used in the heat treatment such as the diffusion step, oxidation step, etc., included in the manufacturing process of a semiconductor device. It was customary to use a process tube made of quartz glass. However, quartz glass tends to be easily softened, deformed and devitrified under high temperatures, leading to a short life of the process tube made of quartz glass.

To overcome these defects, a silicon carbide process tube has come to be widely used recently. However, a tube of this type is also defective in that a porous $SiO_2$ film is formed on the inner surface of the tube a certain period after use. The porous film causes dust generation, leading to a low yield of the semiconductor device. To overcome this difficulty, it is necessary to periodically wash the tube. Recently, the dust-free condition is more strongly demanded in order to meet the requirements for an increased degree of integration and in accordance with the trend toward an increased diameter of the wafer, with the result that the process tube must be washed more frequently. However, the increased washing frequency shortens the life of the process tube. In addition, operation of the manufacturing apparatus of the semiconductor device must be stopped because of the laborious washing of the process tube. Naturally, the manufacturing efficiency of the semiconductor device is lowered.

SUMMARY OF THE INVENTION

An object of the invention is to provide a silicon carbide process tube capable of suppressing the dust generation.

According to the present invention, there is provided a silicon carbide process tube for semiconductor wafers, characterized in that the surface coarseness of the process tube at the portion where a semiconductor wafer is inserted is 150 $\mu$m or less, preferably, 100 $\mu$m or less.

DETAILED DESCRIPTION OF THE PREFERRED EMBODIMENT

Figure 1:
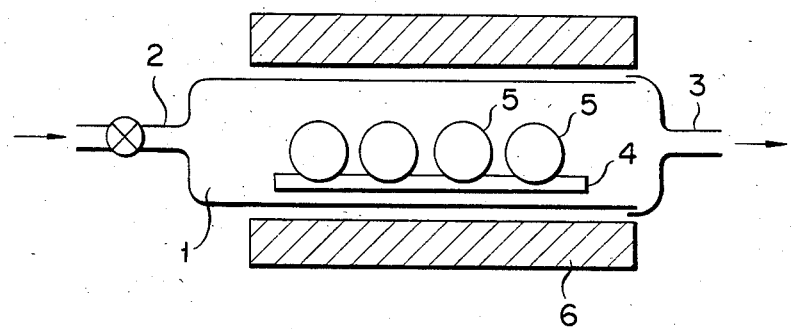
FIG. 1 schematically shows a silicon carbide process tube according to one embodiment of the present invention.

The process tube according to one embodiment of the present invention is schematically shown in FIG. 1. It is seen that a silicon carbide process tube 1 is of a cylindrical shape and is provided with a reaction gas inlet port 2 and a reaction gas outlet port 3. A plurality of semiconductor wafers 5 erected on a susceptor 4 is arranged within the process tube 1 such that the wafers 5 are disposed in parallel. During the operation, the process tube 1 is disposed within a heating furnace 6, e.g., an electric furnace.

In general, dust is generated on the inner surface of the silicon carbide process tube 1. The present inventors have found that a porous $SiO_2$ film is formed on the inner surface of the process tube if the coarseness of the inner surface of the process tube reaches a certain level, leading to the dust generation in question. The present invention is based on this finding.

Figure 2:
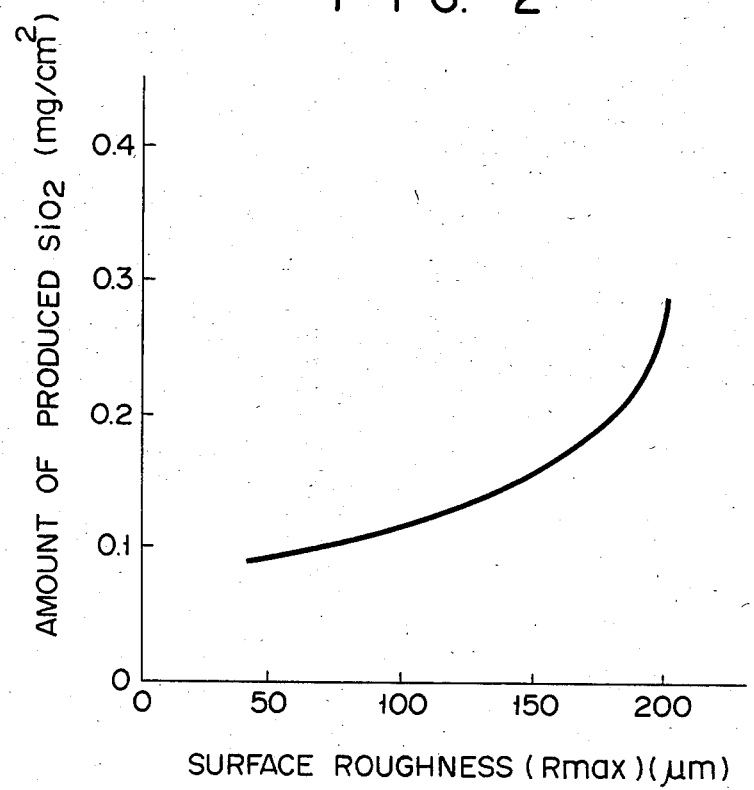
FIG. 2 is a graph showing the relationship between the coarseness on the inner surface of a silicon carbide process tube and the amount of $SiO_2$ formed on the inner surface of the process tube after the wafer treatment for 100 hours.

FIG. 2 shows the results of experiments conducted by the inventors to see the relationship between the coarseness on the inner surface of a silicon carbide process tube and the amount of $SiO_2$ formed on the inner surface of the process tube after the wafer treatment for 100 hours. The coarseness was measured by a tracer method specified in JIS (Japanese Industrial Standards)-B0601. In these experiments, the coarseness on the inner surface of the tube was changed by adjusting the particle size of the raw material SiC. Specifically, the surface coarseness can be diminished by using a raw material SiC having a small particle size.

In preparing the process tube used in the experiments, a tube preform was prepared first by an isostatic press method, slip casting or the like, using a raw material SiC treated with an acid. The preform was subjected to a purifying treatment with, for example, a halogen, followed by allowing the purified preform to be impregnated with Si used in the manufacture of a high purity semiconductor device in order to improve the gas impermeability of the preform. Finally, the preform was treated with an acid so as to obtain a silicon carbide process tube having a wall thickness of 8 mm and an inner surface coarseness of 50 to 200 $\mu$m.

FIG. 2 shows that the amount of $SiO_2$ formed on the inner surface of the process tube is increased in accordance with increase in the inner surface coarseness of the tube. It is seen that, where the coarseness exceeds 150 $\mu$m, the amount of $SiO_2$ formed on the inner surface of the process tube exceeds 0.2 $mg/cm^2$ after the wafer treatment for 100 hours, leading to a prominent dust generation. Of course, the $SiO_2$ formation in question can be suppressed where the inner surface coarseness of the process tube is 150 $\mu$m or less, leading to reduction in the dust generation. Particularly, the $SiO_2$ formation can be markedly suppressed if the coarseness in question is 100 $\mu$m or less as seen from FIG. 2.

It should also be noted that, where the inner surface coarseness of the process tube is 150 $\mu$m or less, preferably, 100 $\mu$m or less, the wafer can be prevented from vibration when a wafer boat is put in or withdrawn from the process tube using a withdrawing rod. Thus, it is possible to prevent the wafer from bearing crystal defects (slip dislocation).

In the embodiment described above, the inner surface coarseness of the process tube was controlled by adjusting the particle size of the raw material SiC. However, it is also possible to control the coarseness by polishing the process tube preform.

As described above, the silicon carbide process tube of the present invention permits suppressing the dust generation, leading to an improved yield of the semiconductor device.

What is claimed is:

1. A process tube made wholly of silicon carbide, comprising a reaction gas inlet port, a reaction gas outlet port, and a central area therebetween defined by the inner circumference of said tube whereat semiconductor wafers may be arranged for heat treatment processing, wherein the surface of said inner circumference has a coarseness of, at most, 150 microns.

2. The process tube according to claim 1, wherein said inner surface coarseness is 100 $\mu$m or less.

* * * * *